(12) United States Patent
Fukushima

(10) Patent No.: US 10,266,341 B2
(45) Date of Patent: Apr. 23, 2019

(54) TEMPORARY STORAGE SYSTEM, CONVEYANCE SYSTEM USING SAME, AND TEMPORARY STORAGE METHOD

(71) Applicant: MURATA MACHINERY, LTD., Kyoto-shi, Kyoto (JP)

(72) Inventor: Masazumi Fukushima, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 87 days.

(21) Appl. No.: 15/502,803

(22) PCT Filed: Jul. 23, 2015

(86) PCT No.: PCT/JP2015/071010
§ 371 (c)(1),
(2) Date: Feb. 9, 2017

(87) PCT Pub. No.: WO2016/039023
PCT Pub. Date: Mar. 17, 2016

(65) Prior Publication Data
US 2017/0233187 A1    Aug. 17, 2017

(30) Foreign Application Priority Data

Sep. 10, 2014 (JP) ................. 2014-184667

(51) Int. Cl.
*B65G 1/04* (2006.01)
*H01L 21/677* (2006.01)

(52) U.S. Cl.
CPC ............ *B65G 1/0464* (2013.01); *B65G 1/04* (2013.01); *B65G 1/0478* (2013.01);
(Continued)

(58) Field of Classification Search
CPC ............... B65G 1/0464; B65G 1/0478; B65G 2201/0297; H01L 21/6773; H01L 21/67733; H01L 21/67769; Y10S 414/14
See application file for complete search history.

(56) References Cited

U.S. PATENT DOCUMENTS

| 7,578,240 B2 * | 8/2009 | Shiwaku ........... H01L 21/67715 104/88.01 |
| 7,780,392 B2 * | 8/2010 | Rogers .............. H01L 21/67769 414/267 |

(Continued)

FOREIGN PATENT DOCUMENTS

| WO | WO-2013167907 A1 * | 11/2013 | ........... B65G 1/0464 |
| WO | WO-2014090684 A1 * | 6/2014 | ........... B65G 1/0464 |

*Primary Examiner* — James Keenan
(74) *Attorney, Agent, or Firm* — Keating & Bennett, LLP

(57) ABSTRACT

A temporary storage system has a large capacity and loads and unloads articles promptly. The temporary storage system includes a grid-shaped travelling rail and buffers over processing equipment except for an area over a load port, and local vehicles travel along the rail. The carriage of the local vehicles is provided with at least a longitudinal travelling unit, at least a lateral travelling unit, and at least an advancement and retraction mechanism selectively advancing one of the longitudinal travelling unit and the lateral travelling unit to a position supported by the travelling rail, and travels along the travelling rail longitudinally and laterally, and the transfer unit of the local vehicles is provided with a hoist and an arm moving the hoist horizontally. The local vehicles stop at a position corresponding to the load port, advances the arm towards the load port, and transfers an article between the load port.

8 Claims, 8 Drawing Sheets

(52) U.S. Cl.
CPC ...... *B65G 1/0492* (2013.01); *H01L 21/67733* (2013.01); *H01L 21/67736* (2013.01); *H01L 21/67769* (2013.01); *B65G 2201/0297* (2013.01); *Y10S 414/14* (2013.01)

(56) References Cited

U.S. PATENT DOCUMENTS

| | | | | |
|---|---|---|---|---|
| 8,628,289 B1* | 1/2014 | Benedict | ............. | B65G 1/0478 414/217 |
| 9,004,840 B2* | 4/2015 | Kinugawa | ......... | H01L 21/67733 414/281 |
| 9,187,260 B2* | 11/2015 | Ota | ........................ | B65G 37/02 |
| 9,385,019 B2* | 7/2016 | Fosnight | ............. | B65G 1/0464 |
| 9,415,934 B2* | 8/2016 | Ikeda | ................... | B65G 1/0464 |
| 9,520,313 B2* | 12/2016 | Ota | ................... | H01L 21/67733 |
| 10,037,908 B2* | 7/2018 | Ota | ................... | H01L 21/67733 |
| 2007/0224026 A1 | 9/2007 | Chang | | |
| 2009/0202331 A1* | 8/2009 | Wada | ................... | B65G 1/0478 414/787 |
| 2010/0290873 A1 | 11/2010 | Bonora et al. | | |
| 2012/0114453 A1* | 5/2012 | Ota | ...................... | B65G 1/0457 414/281 |
| 2012/0275886 A1 | 11/2012 | Ota | | |
| 2013/0264301 A1* | 10/2013 | Kim | ................. | H01L 21/67733 212/71 |
| 2014/0178160 A1* | 6/2014 | Fosnight | ............. | B65G 1/0464 414/222.01 |
| 2015/0110585 A1 | 4/2015 | Ota | | |
| 2015/0307276 A1 | 10/2015 | Hognaland | | |

* cited by examiner

TEMPORARY STORAGE SYSTEM, CONVEYANCE SYSTEM USING SAME, AND TEMPORARY STORAGE METHOD

BACKGROUND OF THE INVENTION

1. Field of the Invention

The present invention relates to a temporary storage system, a transport system including the same, and a temporary storage method.

2. Description of the Related Art

JP2012-111635 discloses a prior art temporary storage system.

SUMMARY OF THE INVENTION

Preferred embodiments of the present invention provide a temporary storage system, a transport system including the same, and a temporary storage method which are capable of storing a large number of articles and loading and unloading articles promptly.

A temporary storage system according to a preferred embodiment of the present invention, for storing articles temporarily between overhead transfer vehicles and at least a load port of processing equipment, includes a travelling rail provided over the processing equipment except for an area over the load port and including longitudinal rails and lateral rails spaced apart by a gap so that openings through which articles may pass are defined by the gap; buffers provided under the openings of the travelling rail; and local vehicles including a carriage travelling over and along the travelling rail and a transfer unit supported by the carriage, the carriage is provided with at least a longitudinal travelling unit travelling longitudinally; at least a lateral travelling unit travelling laterally; and at least an advancement and retraction mechanism selectively advancing one of the longitudinal travelling unit and the lateral travelling unit to a position supported by the travelling rail, and capable of travelling along the travelling rail longitudinally and laterally, wherein the transfer unit is provided with a hoist to raise and lower an article and a hoist transport unit moving the hoist laterally, and the local vehicles stop at a position corresponding to the load port and to advance the hoist transport unit towards the load port so as to transfer an article between the load port.

A transport system according to a preferred embodiment of the present invention includes the above temporary storage system; overhead transfer vehicles; and a travelling rail for the overhead transfer vehicles, and the travelling rail for the overhead transfer vehicles diverges from a common travelling rail to a travelling rail passing over the load port and another travelling rail passing over the intermediate buffer and then to merge. To "diverge and then to merge" indicates, along the travelling direction of the overhead transfer vehicles first to diverge and then to merge. According to this system, transfer of articles between the temporary storage system and the overhead transfer vehicles is made easier. Regarding an overhead transfer vehicle system, when an overhead transfer vehicle is stopping to transfer an article, a following overhead transfer vehicle may avoid the stopped overhead transfer vehicle. Further, if one of the two routes is allocated for normal transport and the other to emergent transport, for emergent transport, overtaking of overhead transfer vehicles may be performed.

A temporary storage method according to a preferred embodiment of the present invention uses the above temporary storage system, and articles are transported between the load port and the buffers by the local vehicles and are stored in the buffers.

According to various preferred embodiments of the present invention, since the travelling rail is provided in a space over the processing equipment, and since the space under the cells of the travelling rail articles is used as the storage position, the temporary storage system having a large capacity is provided. The local vehicles travel longitudinally and laterally over the travelling rail and may change the travelling directions at each cell, and therefore, the system may freely select the route to destinations and may avoid another local vehicle. Therefore, the temporary storage system which may load and unload rapidly and flexibly is provided. Further, since the local vehicles may laterally move and transfer articles with respect to a line connecting the carriage and the transfer unit, no travelling rail over the load port is necessary, and therefore, the overhead transfer vehicle may perform the job without consideration with the travelling rail of the temporary storage system. In this specification, descriptions about the temporary storage system apply to the transport system and the temporary storage method. Further, a hoist preferably includes a lifting device including a winding up mechanism and an elevation platform, for example, and a hoist transport unit is a slide fork, a scara arm, for example.

Preferably, the local vehicles move the hoist by the hoist transport unit, such as a slide fork or a scara arm, at the same time with travelling along the travelling rail. The travelling and advancement and retraction of the arm such as a slide fork or a scara arm are preferably performed at the same time so that the cycle time of transport is made shorter.

Preferably, the local vehicles are further provided with at least a cross point sensor detecting cross points between the longitudinal rails and lateral rails; and at least a mark detection sensor reading marks indicating a stop position and provided on the longitudinal rails or the lateral rails, wherein the local vehicles are able to position the transfer unit just over an opening of destination by stopping at a position where the cross point sensor detects at least one of the cross points, and are able to position the transfer unit at the position corresponding to the load port by stopping at another position indicated by a mark which is read by the mark detection sensor.

With this configuration, the local vehicles are capable of correctly stopping at the position just over a cell and a position and the position corresponding to the load port.

Preferably, the travelling rail further includes at least an intermediate buffer between which both the overhead transfer vehicles and the local vehicles may transfer an article, located at an opposite position to the load port with respect to the travelling rail in a plan view, except for a position directly under the travelling rail. In this case, the overhead transfer vehicle system is provided with a travelling route passing over the load port and another travelling route passing over the intermediate buffer, the travelling route diverges and merges. Consequently, the transfer of articles between the temporary storage system and the overhead transfer vehicles is made easier. Further, regarding the overhead transfer vehicle system, when an overhead transfer vehicle is stopping to transfer an article, a following overhead transfer vehicle may avoid the stopped transfer vehicle. Further, if one of the two routes is allocated for normal transport and the other to emergent transport, for emergent transport, overtaking of overhead transfer vehicles may be performed.

Preferably, the transfer unit is further provided with a turn table supported by the hoist transport unit and capable of rotating the hoist. The turn table rotates articles to a desired direction. Preferably, the hoist transport unit is capable of transferring an article between three positions, including directly under the position of the transfer unit and both side positions of the transfer unit along the perpendicular direction. As a result, the load port may be located more freely to the grid-shaped travelling rail.

Preferably, the advancement and retraction mechanism is operative to raise and lower at least one of the longitudinal travelling unit and the lateral travelling unit. If both the longitudinal and lateral travelling units are able to be raised and lowered, then changing of the travelling units does not change the height of the local vehicles. However, if only one of the travelling units may be raised and lowered, and if the other unit is fixed in its height, then, the advancement and retraction mechanism is made simpler.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

In the following, preferred embodiments of the present invention will be described. The scope of the present invention shall be construed according to the claims, with reference to the specification and well-known arts in the field, in accordance with the understandings of a person skilled in the art.

Figure 1:
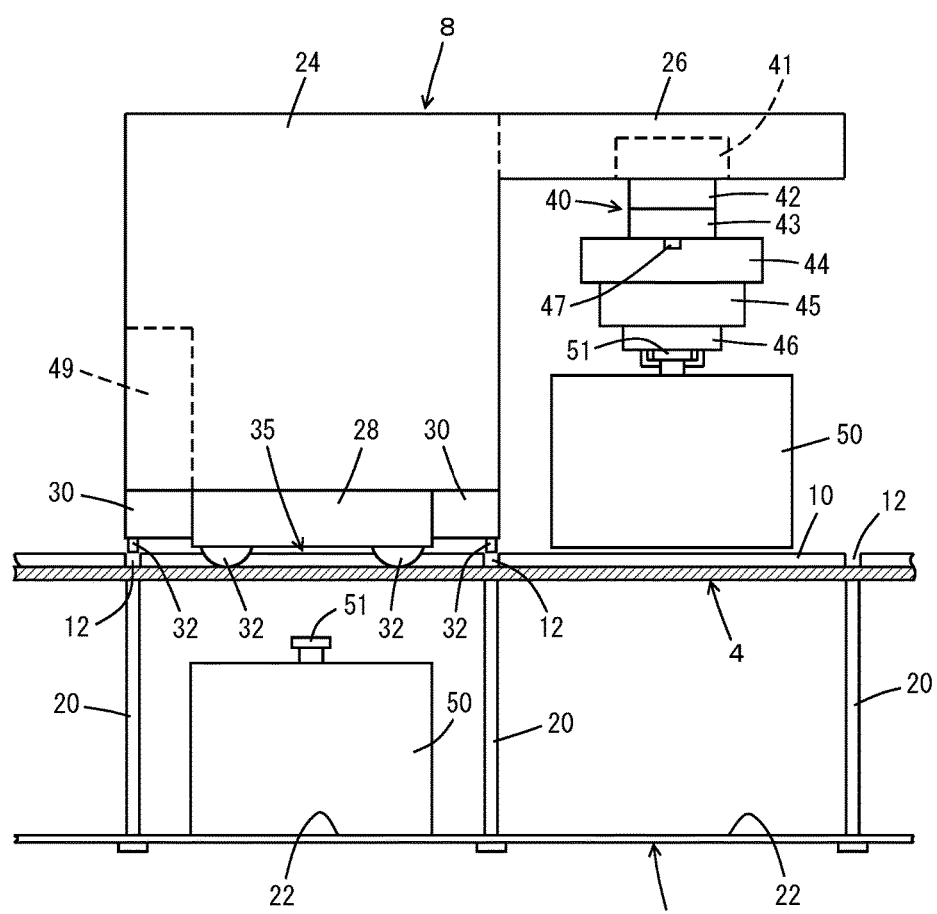
FIG. 1 is a fragmentary side view of the temporary storage system according to a preferred embodiment of the present invention.

FIGS. 1-9 show preferred embodiments of the present invention and modifications thereof. FIG. 1 shows a temporary storage system 2, in particular, a grid-shaped travelling rail 4, a buffer 6, and local vehicles 8. The buffer 6 is provided under the grid-shaped travelling rail 4 along which the local vehicles 8 may travel along lateral and longitudinal directions and stores temporarily cassettes 50 such as FOUP for the accommodation of semiconductor wafers. The grid-shaped travelling rail 4 is supported by pillars (not shown) or the like, for example, from the ceiling of a clean room, and the buffer 6 is supported by columns 20 from the grid-shaped travelling rail 4.

Figure 2:
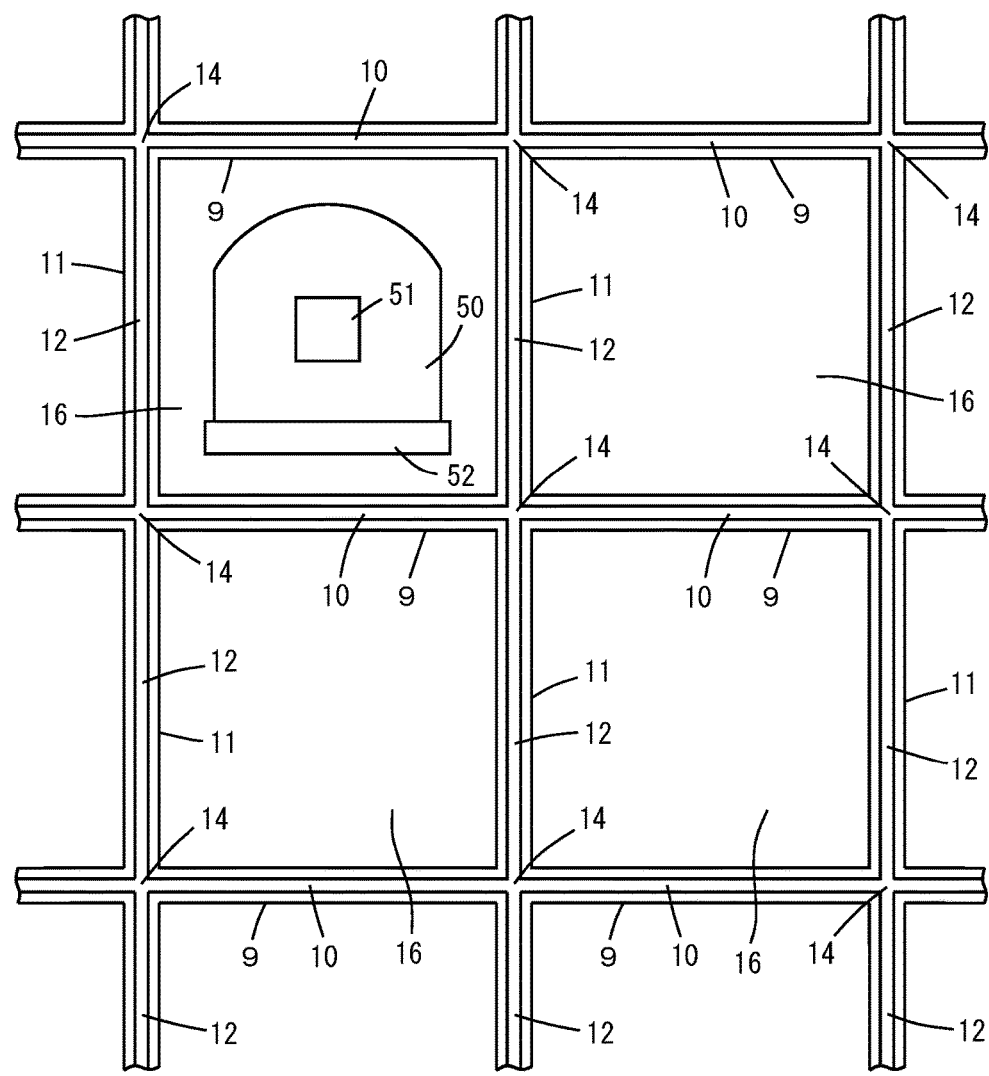
FIG. 2 is a fragmentary plan view of grid-shaped travelling rail according to a preferred embodiment of the present invention.

FIG. 2 shows the structure of the grid-shaped travelling rail 4. Lateral and C-shaped travelling rails 9 have a groove-shaped guide 10, and longitudinal and C-shaped travelling rails 11 include a groove-shaped guide 12, and the travelling rails 9,11 are connected laterally and longitudinally and thus define the grid-shaped travelling rail 4. Points where the guides 10,12 cross each other are cross points 14, the wheels 32 of the local vehicles may travel on the cross points (see FIG. 1), and the travelling rails 9,11 partition the area into cells 16. As shown in FIG. 1, spaces under the cells 16 in the buffer 6 are referred to as buffer cells 22, each buffer cell 22 accommodates for example one cassette 50, and cassettes 50 are vertically transferred through the cells 16. Furthermore, a cassette 50 includes a lid 52 in its front surface and therefore, extends in front and rear directions. Further, as shown in FIG. 1, local vehicles 8 include a carriage 24 and a transfer unit 26 and occupy two cells. Further, one buffer cell 22 may accommodate two or four cassettes 50, for example.

Figure 3:
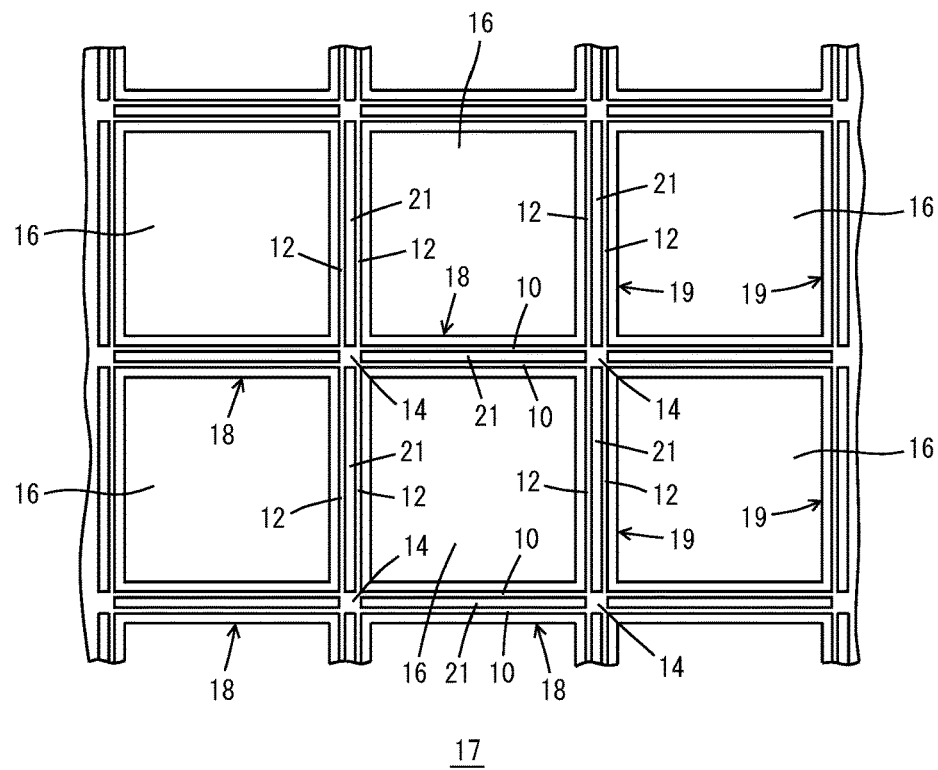
FIG. 3 is a fragmentary plan view of a modified grid-shaped travelling rail.

The grid-shaped travelling rail 4 shown in FIG. 2 does not allow two local vehicles 8 to travel over adjacent cells 16 at the same time. FIG. 3 shows another grid-shaped travelling rail 17 along which two local vehicles 8 may travel simultaneously over adjacent cells 16. A lateral travelling rail 18 is provided with two guides 10, and a longitudinal travelling rail 19 is provided with two guides 12. Separation bands 21 separate the guides 10 from each other and also separate the guides 12 from each other, and each of the separation bands 21 is preferably horizontal bar-shaped.

Figure 4:
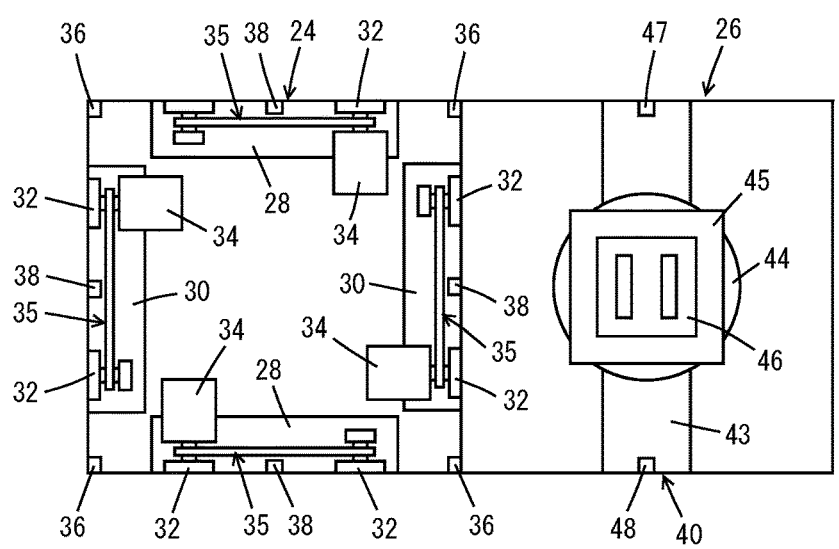
FIG. 4 is a bottom view of a local vehicle according to a preferred embodiment of the present invention.
Figure 5:
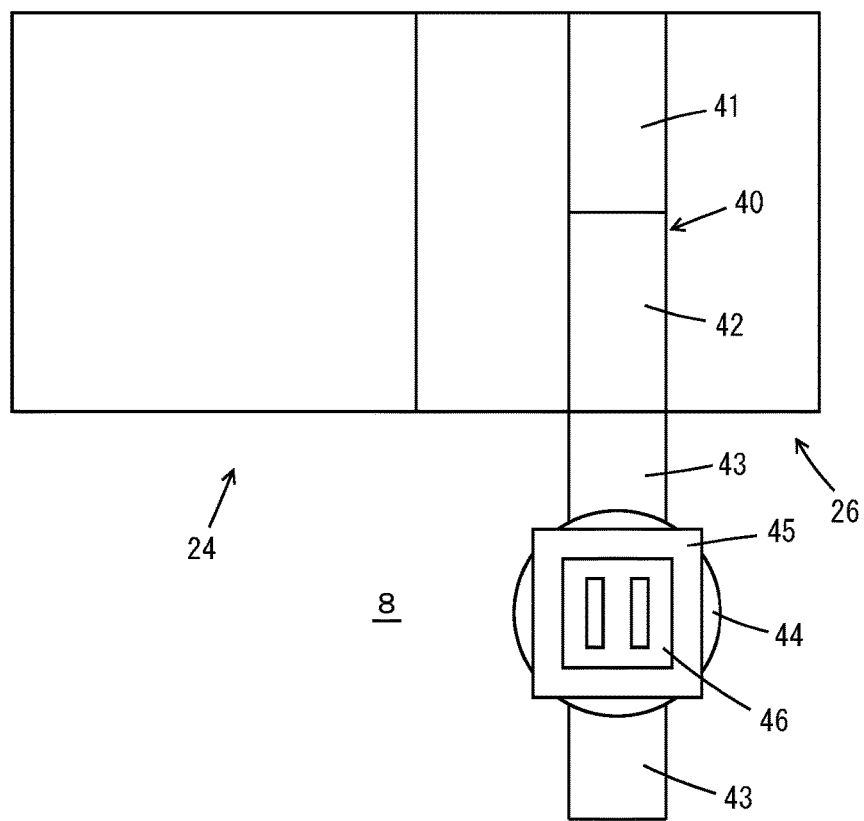
FIG. 5 is a bottom view of the local vehicle stretching a slide fork according to a preferred embodiment of the present invention.

FIGS. 1, 4, and 5 show the structure of the local vehicles 8. The carriage 24 having a size of one cell supports the transfer unit 26 protruding over an adjacent cell. The four sides of the carriage 24 respectively include plural wheels which are guided by the guides 10 and 12 on the four sides of a cell 16 and are driven by travelling motors 34. The wheels 32 and the travelling motor 34 and so on define a travelling unit 35 as a whole, and four travelling units 35 are provided over the four sides of a cell 16, for example. Vertical motion mechanisms 28,30 including a pantograph, a cam, or the like, raise and lower the wheels 32 and motors 34 and so on, the wheels 32 of the carriage 24 are selectively in contact with the guides 10 or the guides 12, and thus, the carriage 24 travels longitudinally and laterally. Guide rollers other than the wheels 32 may be provided in the carriage 24. The carriage 24 is provided with sensors 36 (cross point sensors) at the four corners of its bottom portion, and the sensors 36 detect the cross points 14 so that the carriage 24 is capable of stopping at a position where the center of the carriage 24 and the center of a cell 16 are coincident in a position along a vertical line. Further, the carriage 24 includes barcode readers 38 (mark detection sensors), for example, at the four sides of its bottom portion so as to read barcodes provided on the rails 9 and 11. These barcodes are attached at positions corresponding to the stop positions for load ports 54 described later, may be replaced by magnetic marks, optical marks, linear scales, or the like, and in such cases, other sensors in accordance with the marks are provided in place of the barcode readers 38.

The transfer unit 26 includes a slide fork 40 including a fixed base portion 41, a middle portion 42, and a top portion 43. The top portion 43 advances towards both sides of the transfer unit 26 by a stroke corresponding to the length of one side of the cell 16, for example, and a state where the slide fork 40 is stretched is shown in FIG. 5. Other arms advancing and retracting along a horizontal direction, such as a scara arm, may be used in place of the slide fork 40. The top portion 43 of the slide fork 40 is provided at its bottom portion with a turn table 44 which rotates a lifting device 45, an elevation platform 46, and a cassette 50 by 180 degrees, for example, so as to make the direction of the cassette 50 in order. The lifting device 45 is attached to a lower portion of the turn table 44 and raises and lowers, by belts, ropes, wires, or the like, the elevation platform 46 which chucks a flange 51 of the cassette 50, and thus transfer between the buffer cells 22 and so on is performed. Look down sensors 47 and 48 detect an interfering object such as a human being when transferring a cassette 50 between load ports 54 shown in FIGS. 6 and 7. The look down sensors 47 and 48 are provided at the vicinities of both ends of the top portion 43 along its longitudinal direction and therefore are capable of monitoring the lower space without being disturbed by a cassette 50 which is chucked by the elevation platform 46.

Figure 6:
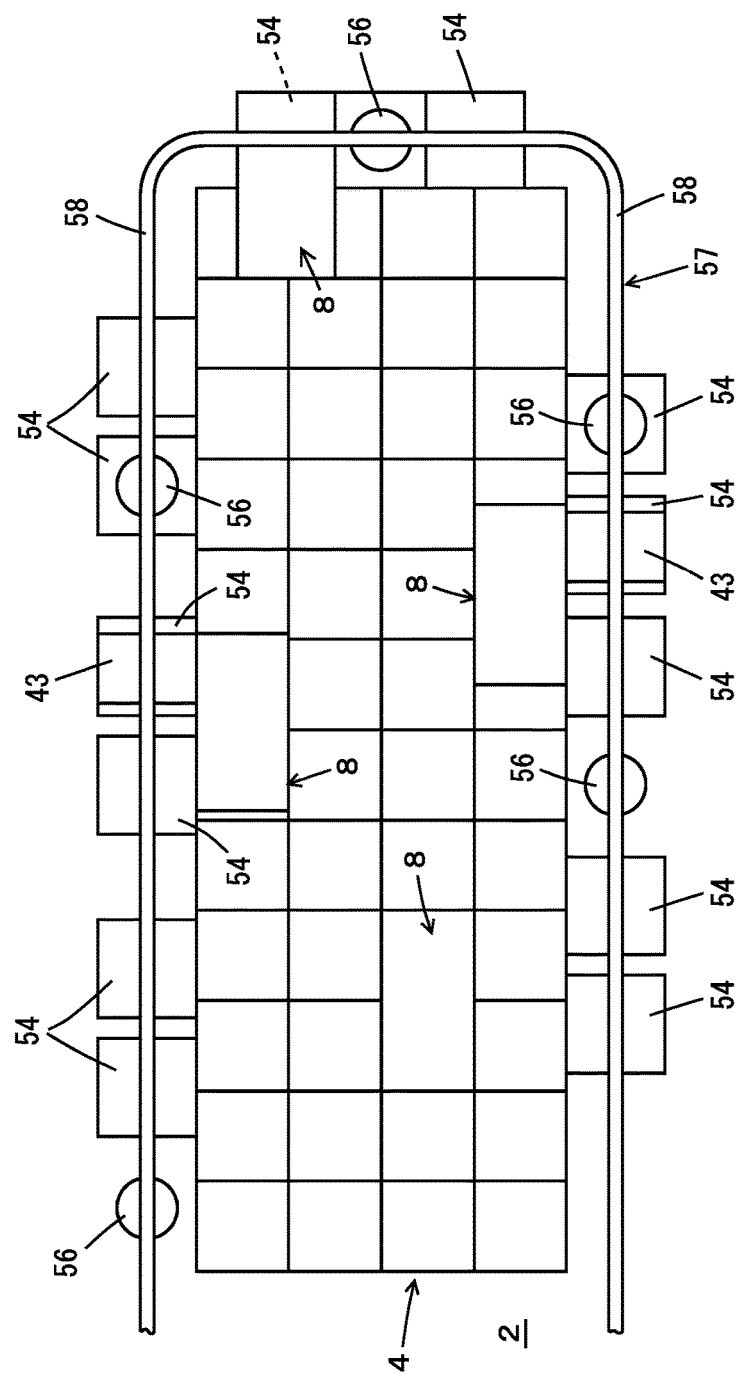
FIG. 6 is a fragmentary plan view of the temporary storage system according to a preferred embodiment of the present invention.
Figure 7:
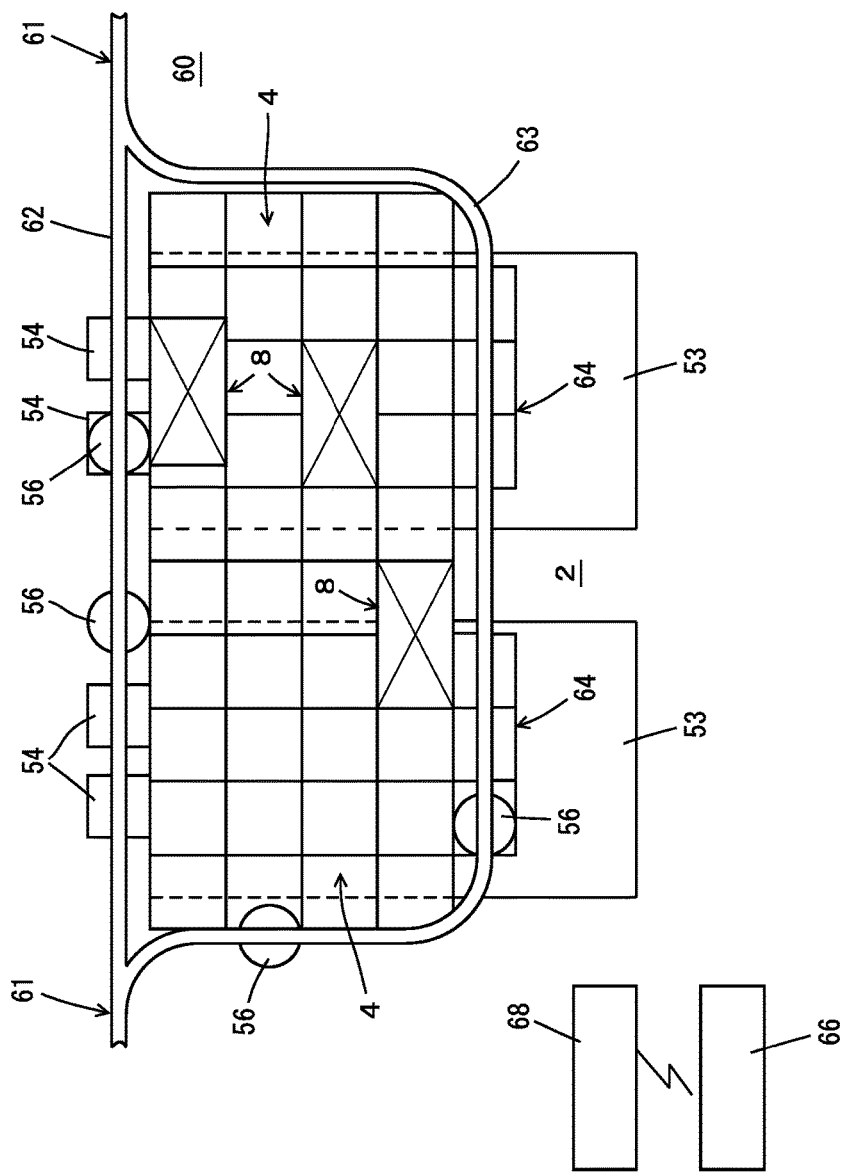
FIG. 7 is a fragmentary plan view of a temporary storage system according to a modification of a preferred embodiment of the present invention.

A sensor to detect presence or absence of a cassette on the buffers 22 and so on, an ID reader to read the IDs of cassettes and so on, and similar sensors may be provided in addition to the look down sensors 47 and 48. Further, the local vehicles 8 may advance the slide fork 40, while travelling. Therefore, interference might occur with an elevation platform, or the like, lowering from an overhead transfer vehicle 56 as shown in FIGS. 6 and 7. Consequently, a further sensor to detect such an interfering object may be provided. A counterweight 49 cancels the moment of force from the transfer unit 26 to the wheels 32 and keeps the center of gravity of the local vehicles within an area surrounded by the plural wheels 32.

FIG. 6 shows the layout of the temporary storage system 2 and an overhead transfer vehicle system 57 according to a preferred embodiment of the present invention. Multiple pieces of processing equipment (not shown) are provided under the grid-shaped travelling rail 4, the load ports 54 of the processing equipment protrude from the grid-shaped travelling rail 4 in a plan view, and a travelling rail 58 of the overhead transfer vehicle system 57 passes over the load ports 54. Note that the actual grid-shaped travelling rail 4 preferably includes more cells in number than one shown in FIG. 6, and thus, the processing equipment may be placed under the grid-shaped travelling rail 4. The local vehicles 8 travel laterally and longitudinally along the grid-shaped travelling rail 4, while they may travel lengthwise and crosswise, but they may not rotate or travel circularly, or the like, and have constant postures. When transferring a cassette between a buffer cell 22 under the grid-shaped travelling rail 4, the local vehicles 8 transfer the cassette between a buffer cell 22 under the transfer unit 26 without stretching the slide fork. Since the load ports 54 are positioned independently of the grid-shaped travelling rail 4, the local vehicles 8 stop at positions where the transfer units 26 face the load ports 54 and stretch the slide forks towards the load ports to transfer cassettes, or protrude the transfer units 26 from the grid-shaped travelling rail 4 to positions over the load ports 54 for the transfer.

FIG. 7 shows the layout of the temporary storage system 2, processing equipment 53, and an overhead transfer vehicle system 60 according to a modification of a preferred embodiment of the present invention. The travelling route 61 of the overhead transfer vehicle system 60 diverges and then merges to and from a main route 62 and a bypass route 63 at the vicinities of the temporary storage system 2. Further, the grid-shaped travelling rail 4 is provided at an area over the processing equipment 53 and interposed by the routes 62 and 63, and the local vehicles 8 may transfer cassettes 50 to and from positions under the routes 62 and 63 with stretching the slide fork 40. The processing equipment 53 preferably includes at least a load port 54 at a position under the main route 62 and not overlapping with an opening in the grid-shaped travelling rail 4 in a plan view. The temporary storage system 2 includes intermediate buffers 64 under the bypass route 63 and, for example, over the processing equipment 53, and they define and function as buffers between the overhead transfer vehicles 56 and the local vehicles 8. In this regard, it is preferable not to provide the travelling rail 4 over the intermediate buffers 64 so as to prevent the transfer by the overhead transfer vehicles 56 from interfering with the travelling rail 4. The temporary storage system 2 includes a controller 66, the overhead transfer vehicle system 60 includes a controller 68, and the controllers prevent, by mutual communication, interference such as interference between transfer by overhead transfer vehicles 56 and the advancing of the slide fork 40 from the local vehicles 8. The routes 62 and 63 including travelling rails (not shown) occupy the highest positions in the vicinity of the ceiling, and the grid-shaped travelling rail 4, the buffer 6, and the intermediate buffers 64 occupy intermediate positions above the processing equipment 53. While the local vehicles 8 travel on a lower plane than the overhead transfer vehicles 56 travel, they may travel at the same height, and the load ports 54 are positioned at the lowest level so that workers may access them.

Figure 8:
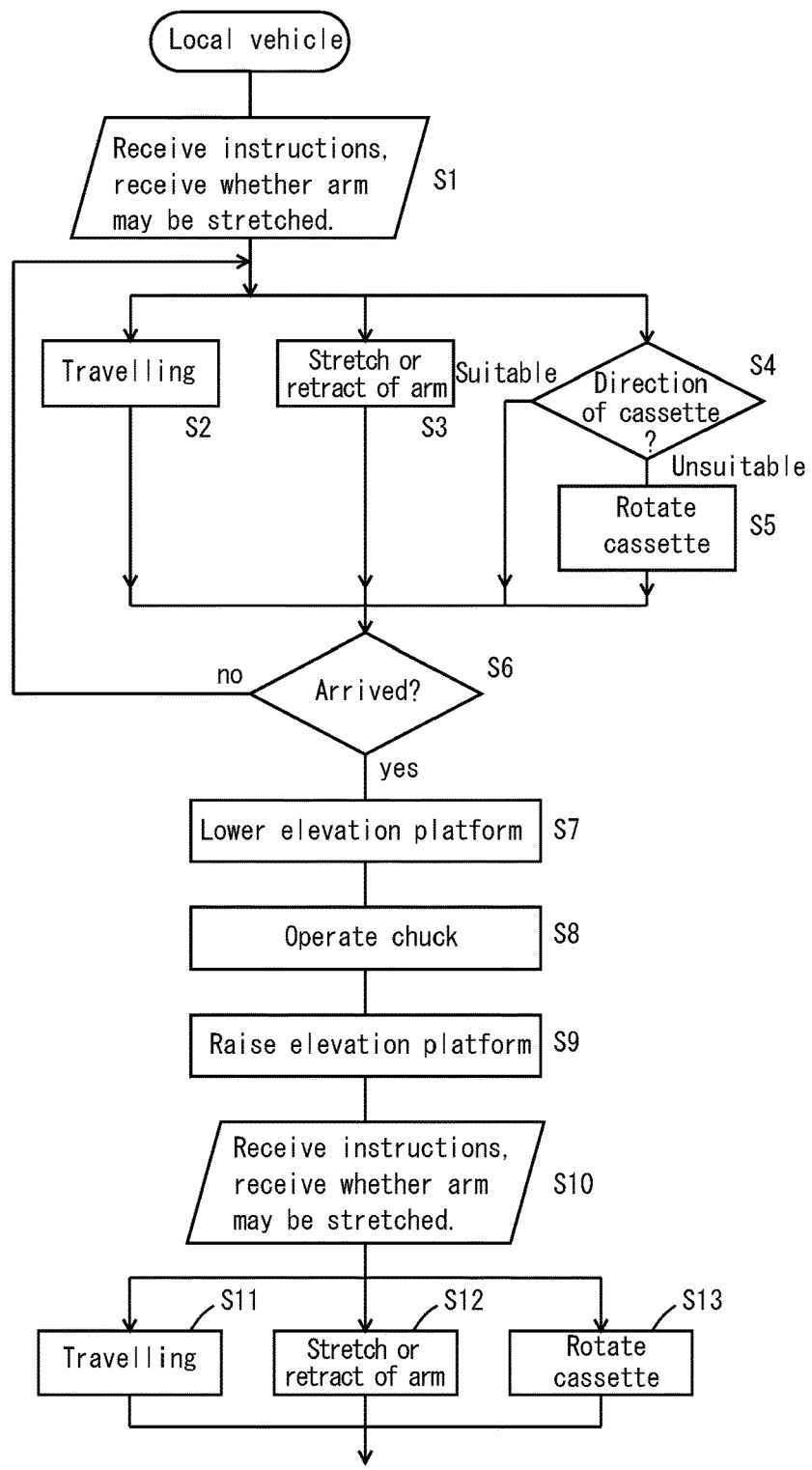
FIG. 8 is a flowchart showing a control algorithm of the local vehicle according to a preferred embodiment of the present invention.

FIG. 8 shows a control algorithm of local vehicles 8 executed by an on-board controller. A local vehicle 8 receives instructions from the controller 66 and further receives at the same time data indicating an area where the slide fork may be advanced (step 1). This data includes ranges within which the slide fork may be advanced for respective positions of the local vehicle (the positions of the carriage 24 indicated by the No. of cell 16). The local vehicle 8 travels along a trajectory instructed by the controller 66 (step 2) and simultaneously, advances the slide fork 40 within the allowed range (step 3.). When the direction of the cassette is not suitable (step 4), the turn table 44 rotates during the travelling so as to adjust the direction of the cassette (step 5). Thus, in parallel with the travelling to the destination, the slide fork is advanced, and the direction of the cassette is adjusted (step 6).

Transfer is ready when the local vehicle has arrived at a destination cell, the slide fork has already advanced, if necessary, and the direction of the cassette is correct. Then, the elevation platform is lowered (step 7). A cassette is chucked or released from being chucked by the motion of chuck (step 8), and the elevation platform is raised (step 9). Thus, a cassette is transferred by the local vehicle between buffer cells 22 of the buffer 6, load ports 54, or intermediate buffers 64. When the next destination after the transfer has not been received, instructions about the next destinations, and so on, including the ranges where the slide fork may be advanced during travelling are received (step 10). Then, at the same time of travelling (step 11), advancement or retraction of the slide fork (step 12) and the rotation of a cassette, if necessary (step 13), are performed, and then, similar steps with the steps 6-9 are performed. For example, when at the former transfer, the slide fork was advanced and at the next destination, the slide fork shall be advanced towards the opposite direction, the slide fork is advanced towards the opposite direction during the travelling.

The stop control of local vehicles 8 will be described. The local vehicles 8 detect cross points 14 at the four corners of a cell 16 by the sensors 36, and, when stopping at a position where the sensors 36 are detecting cross points 14, then, the carriage 24 can stop directly above a cell 16, and so on. Further, since the intermediate buffers 64 are supported by the grid-shaped travelling rail 4, the carriage 24 stops directly above one cell 16 of the grid-shaped travelling rail 4 for the transfer between buffer cells 22 and the intermediate buffers 64. Since it is difficult to align the positions of cells 16 of grid-shaped travelling rail 4 with the load ports 54, the local vehicles 8 stop at positions according to the positions of load ports 54 and different from the center of cells 16, for the transfer between the load ports 64. Therefore, the barcodes, optical marks, magnetic marks, linear scales, or the like, are attached to the travelling rails 9,11 at the four sides of cells 16 to indicate the stop positions. And when a mark detection sensor such as the barcode reader 38 detects a mark and the carriage stops at an indicated position by the mark, then, the carriage may stop at a position suitable for transfer between a load port 54.

The avoidance of interference between the local vehicles 8 and the overhead transfer vehicles 56 will be described. When a local vehicle 8 and an overhead transfer vehicle 56 try transfer simultaneously between the same load ports 54 or the same intermediate buffer 64, then there happens an interference. Therefore, as an exclusion control, the local vehicles 8 and the overhead transfer vehicles 56 require the permission of transfer to terminals of the load ports 54 or the intermediate buffers 64 and perform the transfer after the permission. The overhead transfer vehicles 56 do not laterally move, raise or lower the elevation platform during travelling. However, an interference might occur, if the local vehicles 8 stretch the slide fork towards the route 62 and 63 when an overhead transfer vehicle 56 is stopping and raising or lowering the elevation platform. Therefore, the range where the slide fork may advance is determined with the communication between the controllers 66 and 68 or a sensor provided in the local vehicles 8.

Figure 9:
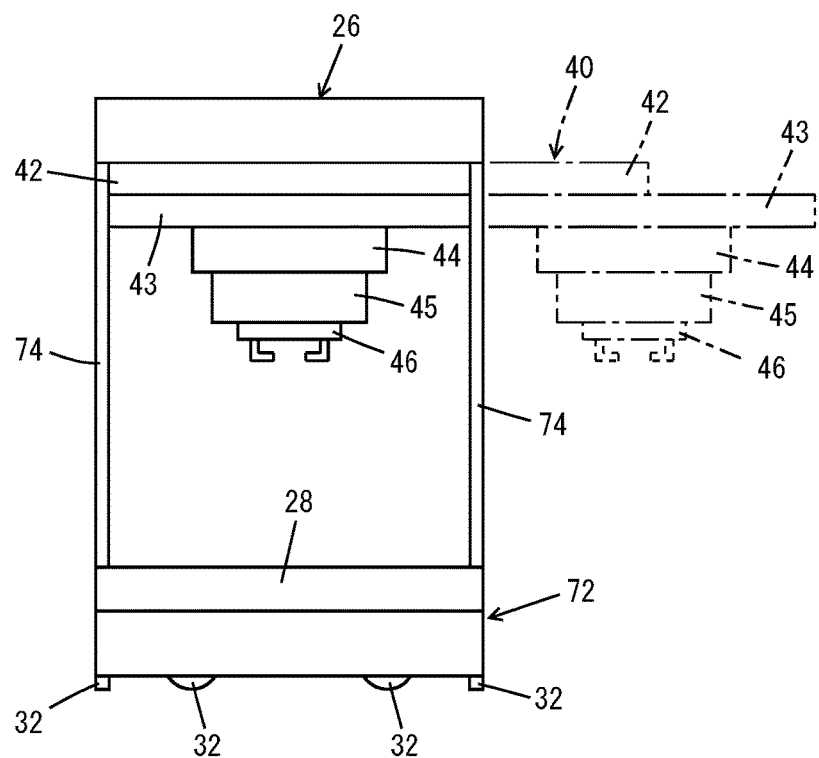
FIG. 9 is a side view of a modified local vehicle according to a preferred embodiment of the present invention.

The local vehicles 8 according to a preferred embodiment of the present invention requires a space corresponding to at least two cells 16 for the carriage 24 and the transfer unit 26. FIG. 9 shows another local vehicle 70 that is provided with the slide fork 40 over a carriage 72 and corresponds to one enlarged cell 16. The carriage 72 is provided with plural wheels 32, motors for driving the wheels 32, and at least a vertical motion mechanism for the wheels 32 and supports the transfer unit 26 by columns 74. Since cassettes have to move over the vertical motion mechanism 28, and so on, the local vehicle 70 becomes taller. FIG. 9 shows a state where the slide fork 40 is stretched with dash-dotted lines.

The operation of a transport system and a temporary storage system according to a preferred embodiment of the present invention will be described.

The overhead transfer vehicle system 60 includes the main route 62 and the bypass route 63, and the overhead transfer vehicles 56 are capable of accessing the load ports 54 and the intermediate buffers 64. Therefore, when an overhead transfer vehicle is stopping to the transfer of the cassette, following overhead transfer vehicles may travel along the other route to avoid it. When allocating one of the routes 62 and 63 to normal transport and the other to emergent transport, for emergent transport, overtaking of overhead transfer vehicles may be performed.

The grid-shaped travelling route 4 may be provided in a wide space over the processing equipment 53. The local vehicles 8 may travel along lateral and longitudinal directions on the grid-shaped travelling rail 4, and, for example, along a travelling rail having a length of five cells, three local vehicles 8 may move laterally in parallel. Since the local vehicles 8 may change the travelling direction at each cell 16, they may freely select the travelling route to the destinations. Therefore, unlike circular travelling, local vehicles may go around and overtake other local vehicles and may move to a destination cell 16 without waiting for the completion of another local vehicle's job. Since each cell 16 may store one or more cassettes, the storage capacity of the cassettes is large. Therefore, a large capacity temporary storage system 2 suitable for rapid cassettes loading and unloading is provided.

The transfer unit 26 protrudes from the carriage 24 to and over an adjacent cell. In addition, by the slide fork 40, the local vehicles 8 may transfer a cassette 50 to three positions from one stop position. Therefore, the grid-shaped travelling rail 4 is not necessary over the load ports 54 or the intermediate buffers 64. There are three stop positions suitable for the transfer between a destination cell in general, and therefore, the local vehicles 8 may select the travelling route flexibly.

The local vehicles 8 may stretch and retract the slide fork 40 and rotate a cassette 50 at the same time with travelling. Travelling, and stretching or retracting of the slide fork need similar amount of time because of short travelling distances, and, since they may be done at the same time, the cycle time of transport is made shorter.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A temporary storage system for storing articles temporarily between overhead transfer vehicles and a load port of processing equipment, the temporary storage system comprising:
   a first travelling rail provided over the processing equipment except for an area over the load port, the first travelling rail including longitudinal rails and lateral rails spaced apart by a gap so that openings through which articles may pass are defined by the gap;
   buffers provided under the openings of the first travelling rail; and
   local vehicles that each include a carriage configured to travel over and along the first travelling rail and a transfer unit supported by the carriage, wherein
   the carriage includes:
     a longitudinal travelling unit configured to travel longitudinally;
     a lateral travelling unit configured to travel laterally; and
     an advancement and retraction mechanism configured to selectively advance one of the longitudinal travelling unit and the lateral travelling unit to a position supported by the first travelling rail, and which is capable of travelling along the first travelling rail longitudinally and laterally;
   the transfer unit is provided with a hoist to raise and lower an article and a hoist transport unit configured to move the hoist laterally; and
   the local vehicles are configured to stop at a position corresponding to the load port and advance the hoist transport unit towards the load port so as to transfer an article to or from the load port.

2. The temporary storage system according to claim 1, wherein the local vehicles are configured to move the hoist by the hoist transport unit simultaneously with the local vehicles travelling along the first travelling rail.

3. The temporary storage system according to claim 1, wherein each of the local vehicles includes:
   a cross point sensor that detects cross points between the longitudinal rails and the lateral rails; and
   a mark detection sensor that reads marks indicating a stop position and provided on the longitudinal rails or the lateral rails; and
   the local vehicles are configured to position the transfer unit over an opening of a destination by stopping at a position where the cross point sensor detects at least one of the cross points, and configured to position the transfer unit at the position corresponding to the load port by stopping at another position indicated by a mark which is read by the mark detection sensor.

4. The temporary storage system according to claim 1, further comprising an intermediate buffer between which the overhead transfer vehicles and the local vehicles are able to transfer an article, wherein the intermediate buffer is located at an opposite position to the load port with respect to the first travelling rail in a plan view and is not positioned directly under the first travelling rail.

5. A transport system comprising:
   the temporary storage system according to claim 4;
   overhead transfer vehicles; and
   a second travelling rail on which the overhead transfer vehicles travel; wherein
   the second travelling rail diverges from a common travelling rail into a load port travelling rail that passes over the load port and an intermediate buffer travelling rail that passes over the intermediate buffer; and
   the load port travelling rail and the intermediate buffer travelling rail merge.

6. The transport system according to claim 5, wherein the advancement and retraction mechanism is configured to raise and lower at least one of the longitudinal travelling unit and the lateral travelling unit.

7. The temporary storage system according to claim 1, wherein the transfer unit includes a turntable supported by the hoist transport unit and capable of rotating the hoist.

8. The temporary storage system according to claim 1, wherein the hoist transport unit is capable of transferring an article between three positions including one position directly under the transfer unit and two positions on sides of the transfer unit.

* * * * *